(12) United States Patent
Adusumilli et al.

(10) Patent No.: US 10,431,542 B2
(45) Date of Patent: Oct. 1, 2019

(54) LOW RESISTANCE SEED ENHANCEMENT SPACERS FOR VOIDLESS INTERCONNECT STRUCTURES

(71) Applicant: International Business Machines Corporation, Armonk, NY (US)

(72) Inventors: Praneet Adusumilli, Albany, NY (US); Joseph F. Maniscalco, Lake Katrine, NY (US); Alexander Reznicek, Troy, NY (US); Oscar van der Straten, Guilderland Center, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/855,686

(22) Filed: Dec. 27, 2017

(65) Prior Publication Data

US 2018/0233445 A1    Aug. 16, 2018

Related U.S. Application Data

(63) Continuation of application No. 15/430,141, filed on Feb. 10, 2017.

(51) Int. Cl.
| | | |
|---|---|---|
| H01L 23/48 | (2006.01) | |
| H01L 23/52 | (2006.01) | |
| H01L 29/40 | (2006.01) | |
| H01L 23/522 | (2006.01) | |
| H01L 23/532 | (2006.01) | |
| H01L 21/768 | (2006.01) | |

(52) U.S. Cl.
CPC .... *H01L 23/5226* (2013.01); *H01L 21/76844* (2013.01); *H01L 21/76882* (2013.01); *H01L 23/53223* (2013.01); *H01L 23/53238* (2013.01)

(58) Field of Classification Search
USPC .............. 257/751, 734, 741, 750, 621, 257/E21.575–E21.597, E21.627; 438/629, 630, 637–640, 668, 672, 675, 438/687, 635, 643, 678, 627
See application file for complete search history.

(56) References Cited

U.S. PATENT DOCUMENTS

| | | | |
|---|---|---|---|
| 6,376,355 B1 | 4/2002 | Yoon et al. | |
| 6,443,743 B1 * | 9/2002 | Saran | H01L 23/5226 174/261 |
| 6,841,477 B1 * | 1/2005 | Uchibori | H01L 21/7681 257/211 |
| 7,169,706 B2 | 1/2007 | Lopatin et al. | |

(Continued)

OTHER PUBLICATIONS https://www.nde-ed.org/GeneralResources/MaterialProperties/ET/Conductivity_Misc.pdf (2002).*

(Continued)

*Primary Examiner* — Niki H Nguyen
(74) *Attorney, Agent, or Firm* — Scully, Scott, Murphy & Presser, P.C.; Daniel P. Morris, Esq.

(57) ABSTRACT

An interconnect structure is provided in which a seed enhancement spacer is present on vertical surfaces, but not a horizontal surface, of a diffusion barrier liner that is located in an opening present in an interconnect dielectric material layer. An interconnect metal or metal alloy structure is present on physically exposed sidewalls of the seed enhancement spacer and on the physically exposed horizontal surface of the diffusion barrier liner.

13 Claims, 4 Drawing Sheets

(56) References Cited

U.S. PATENT DOCUMENTS

| | | | |
|---|---|---|---|
| 7,196,420 B1 | 3/2007 | Burke et al. | |
| 7,300,869 B2 | 11/2007 | Sun et al. | |
| 7,405,153 B2 | 7/2008 | Malhotra et al. | |
| 7,446,047 B2 | 11/2008 | Tsai et al. | |
| 7,714,440 B2 | 5/2010 | Ryu et al. | |
| 8,252,680 B2 | 8/2012 | Lavoie | |
| 8,299,567 B2 | 10/2012 | Wang et al. | |
| 8,435,887 B2 | 5/2013 | Kelly et al. | |
| 10,049,980 B1* | 8/2018 | Adusumilli | H01L 23/53238 |
| 2006/0105520 A1 | 5/2006 | Tan et al. | |
| 2008/0000678 A1 | 1/2008 | Johnston et al. | |
| 2009/0108450 A1 | 4/2009 | Lloyd, Jr. et al. | |
| 2009/0280649 A1* | 11/2009 | Mayer | B23H 5/08 |
| | | | 438/676 |
| 2009/0283907 A1 | 11/2009 | Goswami et al. | |
| 2010/0078818 A1* | 4/2010 | Ishizaka | H01L 21/76831 |
| | | | 257/751 |
| 2010/0252928 A1* | 10/2010 | Ohtsuka | H01L 21/28556 |
| | | | 257/751 |
| 2011/0163449 A1 | 7/2011 | Kelly et al. | |
| 2012/0086101 A1* | 4/2012 | DeMuynck | H01L 21/76834 |
| | | | 257/531 |
| 2013/0334691 A1 | 12/2013 | Farooq et al. | |
| 2014/0220777 A1* | 8/2014 | Yang | H01L 21/02697 |
| | | | 438/653 |
| 2014/0287577 A1* | 9/2014 | Emesh | H01L 21/76879 |
| | | | 438/618 |

OTHER PUBLICATIONS

List of IBM Patents or Patent Applications Treated as Related dated Dec. 27, 2017, 2 pages.
Notice of Allowance dated Mar. 16, 2018 received in the parent U.S. Appl. No. 15/430,141, copy not enclosed.

\* cited by examiner

LOW RESISTANCE SEED ENHANCEMENT SPACERS FOR VOIDLESS INTERCONNECT STRUCTURES

BACKGROUND

The present application relates to an interconnect structure and a method of forming the same. More particularly, the present application relates to a low resistance interconnect structure in which voids between the inner sidewalls of a diffusion barrier liner and an interconnect metal or metal alloy structure are prevented.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structures typically include copper, Cu, since Cu based interconnects provide higher speed signal transmission between large numbers of transistors on a complex semiconductor chip as compared with aluminum, Al, based interconnects.

As the interconnect structure feature sizes shrink, it is necessary to scale barrier thickness in order to maximize copper volume and to enable low line and via resistance. Scaling the sidewall barrier thickness allows maximization of copper volume in interconnect structures, and scaling the barrier thickness at the via bottom allows reduction of via resistance.

For void-free copper fill at less than about 24 nm critical dimensions, an additional liner or seed enhancement layer such as, for example, a layer of ruthenium, is needed to avoid barrier exposure during copper plating, especially on the sidewalls. Without a seed enhancement layer, sidewall voids will form and lead to poor electromigration (EM) performance. The presence of a seed enhancement layer, however, has a negative impact on the via and line resistance. As such, there is a need for providing an interconnect structure that includes a seed enhancement layer, while avoiding an increase in the via and line resistance of the interconnect structure.

SUMMARY

An interconnect structure is provided in which a seed enhancement spacer is present on vertical surfaces, but not a horizontal surface, of a diffusion barrier liner that is located in an opening present in an interconnect dielectric material layer. An interconnect metal or metal alloy structure is present on physically exposed sidewalls of the seed enhancement spacer and on the physically exposed horizontal surface of the diffusion barrier liner.

In one aspect of the present application, a structure is provided. In one embodiment, the structure includes a first interconnect level, the first interconnect level includes a first interconnect dielectric material layer containing a first opening having vertical sidewalls and a bottom wall. A first diffusion barrier liner is located in the first opening and lines the vertical sidewalls and the bottom wall of the first opening, a first seed enhancement spacer directly contacts each inner sidewall of the first diffusion barrier liner, and a first interconnect metal or metal alloy structure directly contacts inner sidewalls of each first seed enhancement spacer and a horizontal portion of the first diffusion barrier liner that is located on the bottom wall of the first opening.

In another aspect of the present application, a method of forming a structure is provided. In one embodiment, the method may include providing an opening in an interconnect dielectric material layer. Next, a diffusion barrier material layer is formed in the opening and on a topmost surface of the interconnect dielectric material layer. A seed enhancement pre-spacer is then formed directly contacting each inner sidewall of the diffusion barrier material layer. Next, an interconnect metal or metal alloy is formed on physically exposed surfaces of the seed enhancement pre-spacers and the diffusion barrier material layer. Portions of the interconnect metal or metal alloy, the seed enhancement pre-spacers and the diffusion barrier material layer that are present outside the opening are removed to provide an interconnect structure in the opening. The interconnect structure includes a remaining portion of the diffusion barrier material layer located in the opening and lining vertical sidewalls and a bottom wall of the opening, a remaining portion of the seed enhancement pre-spacer directly contacting each inner sidewall of the remaining portion of the diffusion barrier material layer, and a remaining portion of the interconnect metal or metal alloy directly contacting inner sidewalls of each remaining portion of the seed enhancement pre-spacers and a horizontal portion of the remaining portion of the diffusion barrier material layer that is located on the bottom wall of the opening.

DETAILED DESCRIPTION

Figure 1:
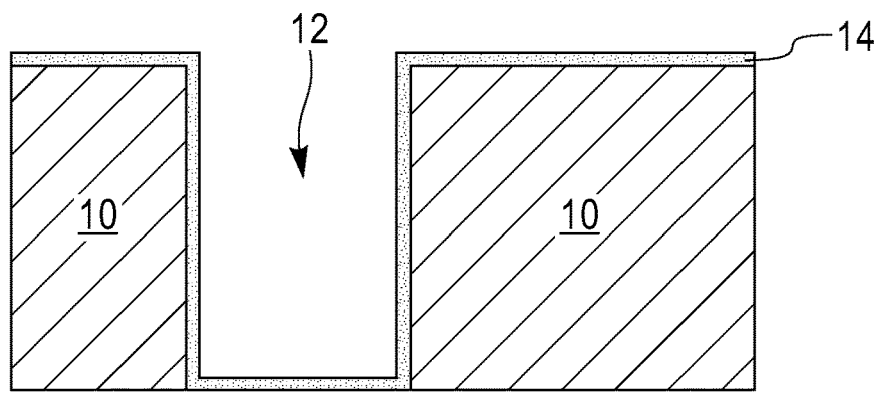
FIG. 1 is a cross sectional view of an exemplary structure including a first opening in a first interconnect dielectric material layer, wherein a first diffusion barrier material layer is present on physically exposed surfaces of the first interconnect dielectric material layer, which can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. Notably, the exemplary structure of FIG. 1 includes a first opening 12 in a first interconnect dielectric material layer 10, wherein a first diffusion barrier material layer 14 is present on physically exposed surfaces of the first interconnect dielectric material layer 10.

In some embodiments (not shown), a base substrate can be located directly beneath the first interconnect dielectric material layer 10. When present, the base substrate may be composed of a semiconductor material, an insulator material, a conductive material or any combination thereof. When the base substrate is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, base substrate can be a layered semiconductor such as, for example, Si/SiGe, Si/SiC, silicon-on-insulators (SOIs) or silicon germanium-on-insulators (SGOIs).

When the base substrate is an insulator material, the insulator material can be an organic dielectric material, an inorganic dielectric material or any combination thereof including multilayers. The insulator material that may provide the base substrate is typically, but not necessarily always, composed of a different dielectric material than the first interconnect dielectric material layer 10. When base substrate is a conductive material, base substrate may include, for example, polySi, an elemental metal, alloys of elemental metals, a metal silicide, a metal nitride or any combination thereof including multilayers.

When base substrate is composed of a semiconductor material, one or more semiconductor devices such as, for example, complementary metal oxide semiconductor (CMOS) devices can be fabricated thereon. When base substrate is composed of a combination of an insulator material and a conductive material, base substrate may represent an underlying interconnect level of a multilayered interconnect structure.

The first interconnect dielectric material layer 10 may include any interlevel or intralevel dielectric material including inorganic dielectrics or organic dielectrics. A single interlevel or intralevel dielectric material may be used, or a multilayered dielectric material stack of at least two different interlevel or intralevel dielectrics may be used. In one embodiment, the first interconnect dielectric material layer 10 may be non-porous. In another embodiment, the first interconnect dielectric material layer 10 may be porous. Some examples of suitable dielectrics that can be used as the first interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material that provides the first interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectric materials generally have a lower parasitic cross talk as compared with dielectric materials that have a higher dielectric constant than 4.0. The thickness of dielectric material that provides the first interconnect dielectric material layer 10 may vary depending upon the type of dielectric material(s) used. In one example, the dielectric material that provides the first interconnect dielectric material layer 10 may have a thickness from 50 nm to 1000 nm. Other thicknesses that are lesser than, or greater than, the aforementioned thickness range may also be employed in the present application for the thickness of the dielectric material that provides the first interconnect dielectric material layer 10.

The dielectric material that provides the first interconnect dielectric material layer 10 may be formed utilizing a deposition process such as, for example, chemical vapor deposition (CVD), plasma enhanced chemical vapor deposition (PECVD) or spin-on coating.

After providing the first interconnect dielectric material layer 10, a first opening 12 is formed into the first interconnect dielectric material layer 10. The first opening 12 has vertical sidewalls and a bottom (horizontal) wall. Although the present application describes and illustrates forming a single first opening 12 into the first interconnect dielectric material layer 10, a plurality of openings can be formed into the first interconnect dielectric material layer 10.

The first opening 12 can be formed utilizing a patterning process. In one embodiment, the patterning process may include lithography and etching. The lithographic process includes forming a photoresist (not shown) atop a material or material stack to be patterned, i.e., the first interconnect dielectric material layer 10, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the first opening 12 into the first interconnect dielectric material layer 10. In some embodiments as is shown, first opening 12 extends entirely through the first interconnect dielectric material layer 10. In such an embodiment, the first opening 12 physically exposes a portion of the underlying base substrate. In yet another embodiment (not shown), the first opening 12 stops within the first interconnect dielectric material layer 10 exposing a sub-surface portion of the first interconnect dielectric material layer 10. By "sub-surface portion" it is meant a portion of a material that is located between a topmost surface and a bottommost surface of the material. When multiple first openings are formed, the openings may have a same depth, or they may have different depths.

The first opening 12 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the first opening 12 is a line opening. When a combined via/line is formed a dual damascene process (including at least one iteration of the above mentioned lithography and etching steps) can be employed.

Next, first diffusion barrier material layer 14 is formed on all physically exposed surfaces of the first interconnect dielectric material layer 10 and, if applicable, a physically exposed portion of the underlying base substrate. The first diffusion barrier material layer 14 is a continuous layer that is present on a topmost surface of the first interconnect dielectric material layer 10 as well as all physically exposed surfaces within first opening 12. The first diffusion barrier material layer 14 thus lines the vertical sidewalls and the bottom wall of the first opening 12.

The first diffusion barrier material layer 14 includes any diffusion barrier material or stack of diffusion barrier materials that can serve as a barrier to prevent a conductive material from diffusing there through. Illustrative examples of diffusion barrier materials that can provide the first diffusion barrier material layer 14 include, but are not limited to, Ta, TaN, Ti, TiN, W, or WN. The first diffusion barrier material layer 14 may have a thickness from 2 nm to 50 nm. Other thicknesses for the first diffusion barrier material layer 14 are contemplated and can be employed in the present application as long as the thickness of the first diffusion barrier material layer 14 does not fill in the entirety of the first opening 12. In some embodiments, the first diffusion barrier material layer 14 is a conformal layer. By 'conformal layer' it is meant, that a material has a thickness as measured vertically from a bottommost surface to a topmost surface that is the same as a thickness as measured horizontally from an inner sidewall surface to an outer sidewall surface.

The first diffusion barrier material layer 14 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 2:
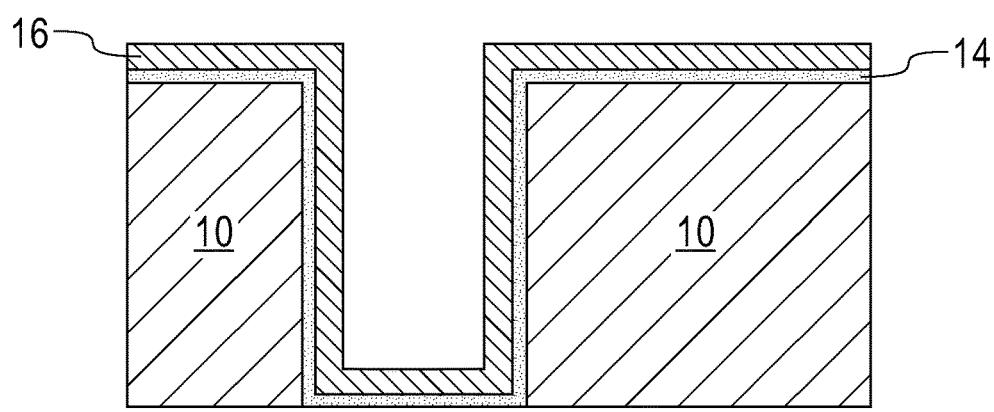
FIG. 2 is a cross sectional view of the exemplary structure of FIG. 1 after forming a first seed enhancement layer on a physically exposed surface of the first diffusion barrier material layer.

Referring now to FIG. 2, there is illustrated the exemplary structure of FIG. 1 after forming a first seed enhancement layer 16 on a physically exposed surface of the first diffusion barrier material layer 14. The first seed enhancement layer 16 is a continuous layer that is present on the entirety of the first diffusion barrier material layer 14. In some embodiments, the first seed enhancement layer 16 is a conformal layer, as defined above.

The first seed enhancement layer 16 includes any low resistance metal or metal alloy that facilitates the subsequent formation of an interconnect metal or metal alloy. By "low resistance" it is meant, a metal or metal alloy having a resistivity of 15E-8 ohm-meter or less. In some embodiments, the first seed enhancement layer 16 may be composed of a metal or metal alloy that may also facilitate the movement (i.e., flow) of an interconnect metal or metal alloy during a subsequently performed reflow anneal process. Examples of metals or metal alloys that may be employed as the first seed enhancement layer 16 include ruthenium, rhodium, iridium, osmium, cobalt and alloys that include at least one of ruthenium, rhodium, iridium, osmium, and cobalt. In one embodiment and when a layer of copper is to be subsequently formed and reflowed, the first seed enhancement layer 16 is composed of ruthenium. In some embodiments, and as shown, the first seed enhancement layer 16 is a single layer of one of the aforementioned metals or metal alloys. In another embodiment (not shown), the first seed enhancement layer 16 is composed of a multilayered stack including at least a first layer of a first metal or metal alloy, and a second layer of a second metal or metal alloy, wherein the second metal or metal alloy differs in composition from the first metal or metal alloy.

The first seed enhancement layer 16 may have a thickness from 1 nm to 80 nm. Other thicknesses for the first seed enhancement layer 16 are contemplated and can be employed in the present application as long as the thickness of the first seed enhancement layer 16 (as well as the combined thicknesses of the first seed enhancement layer 16 and the first diffusion barrier material layer 14) do not fill in the entirety of the first opening 12. The first seed enhancement layer 16 can be formed by a conventional deposition process including, for example, CVD, PECVD, ALD, or PVD.

Figure 3:
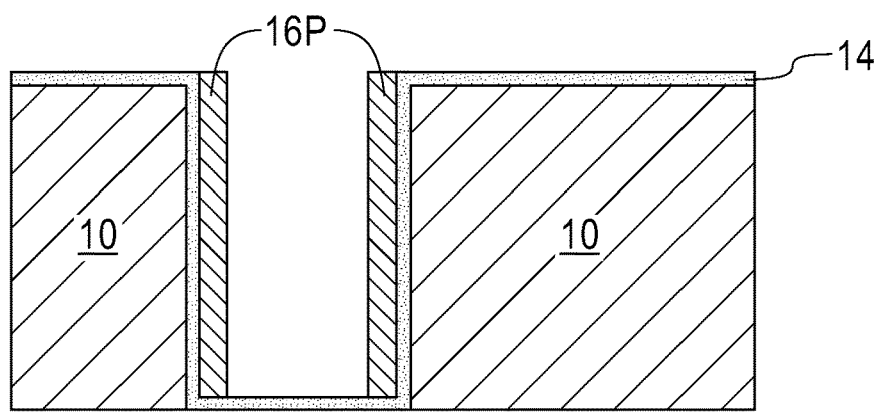
FIG. 3 is a cross sectional view of the exemplary structure of FIG. 2 after removing the first seed enhancement layer from horizontal surfaces of the first diffusion barrier material layer, while maintaining a portion of the first seed enhancement layer on vertical surfaces of the first diffusion barrier material layer in the first opening.

Referring now to FIG. 3, there is illustrated the exemplary structure of FIG. 2 after removing the first seed enhancement layer 16 from horizontal surfaces of the first diffusion barrier material layer 14, while maintaining a portion of the first seed enhancement layer 16 on vertical surfaces of the first diffusion barrier material layer 14 in the first opening 12. Each remaining portion of the first seed enhancement material layer 16 may be referred to herein as a first seed enhancement pre-spacer 16P. By 'pre-spacer' it is meant a vertical extending pillar or sheet of seed enhancement material which is present prior to formation of an interconnect metal or metal alloy structure. Each first seed enhancement pre-spacer 16P has an outer sidewall that is in direct physical contact with an inner sidewall of the first diffusion barrier material layer 14, and an inner sidewall that at this point of the present application is bare, i.e., physically exposed. As is shown, each first seed enhancement pre-spacer 16P has a bottommost surface that is located only on a portion of the horizontal surface of the first diffusion barrier material layer 14 that is present inside the first opening 12; another portion of the horizontal surface of the first diffusion barrier material layer 14 that is present inside the first opening 12 and that is not covered by the first seed enhancement pre-spacers 16P is physically exposed.

In one embodiment, each first seed enhancement pre-spacer 16P can be formed by subjecting the first seed enhancement layer 16 to a spacer etch. In an example, the spacer etch may include a dry etching process such as, for example, reactive ion etching. In another embodiment, each first seed enhancement pre-spacer 16P can be formed by subjecting the first seed enhancement layer 16 to a sputtering process such as, for example, argon sputtering.

Figure 4:
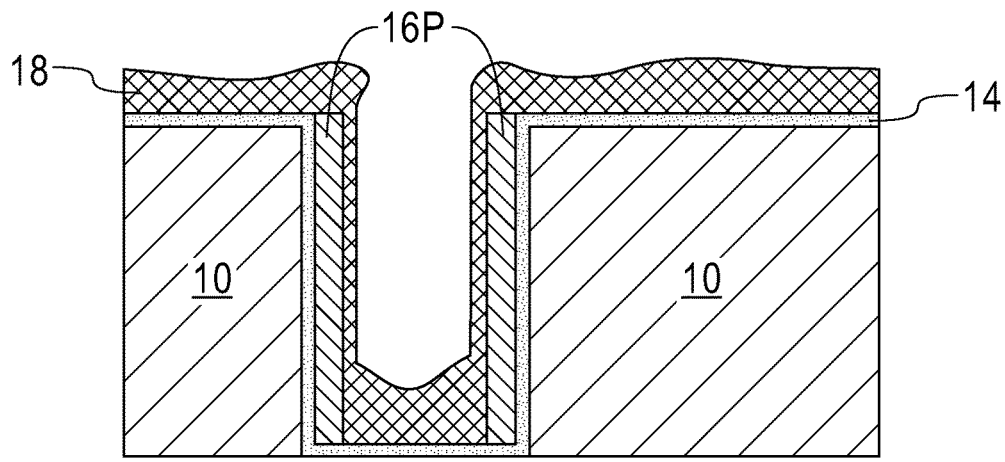
FIG. 4 is a cross sectional view of the exemplary structure of FIG. 3 after forming a first interconnect metal seed or metal alloy seed layer.
Figure 5:
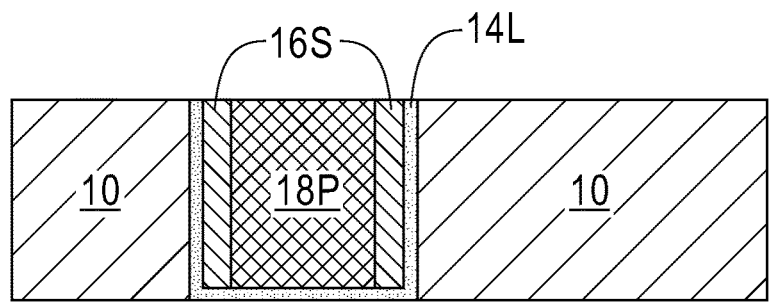
FIG. 5 is a cross sectional view of the exemplary structure of FIG. 4 after forming a first interconnect metal or metal alloy structure in the first opening.

Referring now to FIG. 4, there is illustrated the exemplary structure of FIG. 3 after forming a first interconnect metal seed or metal alloy seed layer 18. In one embodiment, and as shown, the first interconnect metal seed or metal alloy seed layer 18 is a non-conformal layer that does not fill in the entirety of the remaining volume of the first opening 12. In such an embodiment, the thickness of the first interconnect metal seed or metal alloy seed layer 18 along horizontal surfaces is greater than the thickness of the first interconnect metal seed or metal alloy seed layer 18 along vertical surfaces. In such an embodiment, the interconnect metal seed or metal alloy seed layer deposition may be followed by an interconnect metal or metal alloy fill process such as electroplating to fill the opening with an interconnect metal or metal alloy, and form an overburden of the interconnect metal or metal alloy outside the first opening 12. In other embodiments (not shown), a first interconnect metal or metal alloy is formed that fills in the entirety of the first opening 12 and an overburden portion is present outside the first opening 12. In the present application, the first opening is filled with a first interconnect metal or metal alloy prior to performing a planarization step as shown in FIG. 5. The first interconnect metal or metal alloy includes one of the materials mentioned below for the first interconnect metal seed or metal alloy seed layer 18.

The first interconnect metal seed or metal alloy seed layer 18 is composed of any interconnect metal or metal alloy such as, for example, copper, aluminum, or a copper-aluminum alloy (the copper-aluminum alloy may, in one embodiment, contain a higher content of copper than aluminum, or, in another embodiment contain a higher content of aluminum than copper). Typically, copper or a copper-aluminum is employed as the first interconnect metal seed or metal alloy seed layer 18.

The interconnect metal seed or metal alloy seed layer 18 can be formed by a deposition process including physical vapor deposition (PVD), chemical vapor deposition (CVD), plasma enhanced chemical vapor deposition (PECVD), sputtering, chemical solution deposition or plating. In one embodiment, a bottom-up plating process is subsequently employed in filling the first opening 12 with an interconnect metal or metal alloy such as, for example, copper or a copper alloy.

In some embodiments, a reflow anneal (not shown) can be performed; the reflow anneal is performed prior to performing a subsequent planarization process that provides the exemplary structure shown in FIG. 5. The reflow anneal is employed in instances in which a non-conformal first interconnect metal seed or metal alloy seed layer 18 is formed and the reflow anneal causes the interconnect metal or metal alloy to flow into the first opening 12 such that the first opening 12 is completely filled with the interconnect metal or metal alloy.

In one embodiment, the reflow anneal is a thermal anneal. In one example, the reflow anneal may include a furnace anneal or a hot plate anneal. The reflow anneal may be performed at a temperature from 100° C. to 500° C. Other temperatures can also be employed so long as the selected reflow anneal temperature causes the reflow of the interconnect metal or metal alloy. The duration of the reflow anneal may vary depending upon the temperature used during the thermal anneal. In one embodiment and for a temperature from 100° C. to 500° C., the reflow anneal may be performed for a duration of 30 seconds to 3 hours. The reflow anneal is typically performed in a nitrogen-containing ambient or a hydrogen-containing ambient. The nitrogen-containing ambients that can be employed in the present application include, but are not limited to, $N_2$, or $NH_3$, and mixtures thereof. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient. Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical.

Referring now to FIG. 5, there is shown the exemplary structure of FIG. 4 after forming a first interconnect metal or metal alloy structure 18P in the first opening 12. The first interconnect metal or metal alloy structure 18P is formed by performing a planarization process. The planarization, which may include chemical mechanical polishing and/or grinding, removes all material that is present outside the first opening 12 and that is located above the topmost surface of the first interconnect dielectric material layer 10. Thus, the planarization removes the first interconnect metal or metal alloy (or the reflowed first interconnect metal or metal alloy), an upper portion of each first seed enhancement pre-spacer 16P, and the first diffusion barrier material layer 14. The remaining portion of the first interconnect metal seed or metal alloy (or the reflowed first interconnect metal or metal alloy) can be referred to as a first interconnect metal or metal alloy structure, each remaining portion of each first seed enhancement pre-spacer 16P can be referred to a first seed enhancement spacer 16S, and the remaining portion of the first diffusion barrier material layer 14 can be referred to as a first diffusion barrier liner 14L.

In the embodiment illustrated, the first diffusion barrier liner 14L is U-shaped. By "U-shaped" it meant a material that includes a horizontal portion and two vertical portions that extend upwards from the opposing ends of the horizontal portion. Each first seed enhancement spacer 16S is a vertical pillar (and is I-shaped) that extends upward from a portion of the horizontal surface of the first diffusion barrier liner 14L. In the illustrated embodiment, the first diffusion barrier liner 14L, the first seed enhancement spacers 16S, and the first interconnect metal or metal alloy structure 18P each have a topmost surface that is coplanar with each other as well as being coplanar with a topmost surface of the first interconnect dielectric material layer 10. As is shown, a bottommost surface of the first interconnect metal or metal alloy structure 18P directly contacts a portion of the horizontal surface of the first diffusion barrier liner 14L which is not covered by the first seed enhancement spacers 16S.

Each first seed enhancement spacer 16S has an inner sidewall that directly contacts a sidewall of the first interconnect metal or metal alloy structure 18P and an outer sidewall that directly contacts a vertical portion of the first diffusion barrier liner 14L. The sidewalls of the first interconnect metal or metal alloy structure 18P are thus spaced apart from the vertical portions of the first diffusion barrier liner 14L by the first seed enhancement spacers 16S. The presence of the first seed enhancement spacers 16S prevents the formation of sidewall voids, while enabling low via and line resistance within the structure.

FIG. 5 represents a first interconnect level of the present application. The first interconnect level includes the first interconnect dielectric material layer 10 containing the first opening 12 having vertical sidewalls and a bottom wall. The first diffusion barrier liner 14L is located in the first opening 12 and lines the vertical sidewalls and the bottom wall of the first opening 12, the first seed enhancement spacer 16S is directly contacting each inner sidewall of the first diffusion barrier liner 14L, and a first interconnect metal or metal alloy structure 18P directly contacts inner sidewalls of each first seed enhancement spacer 16S and a horizontal portion of the first diffusion barrier liner 14L that is located on the bottom wall of the first opening 12. Collectively, elements 14L, 16S and 18P may be referred to as a first interconnect structure that is embedded in the first dielectric material layer 10.

Figure 6:
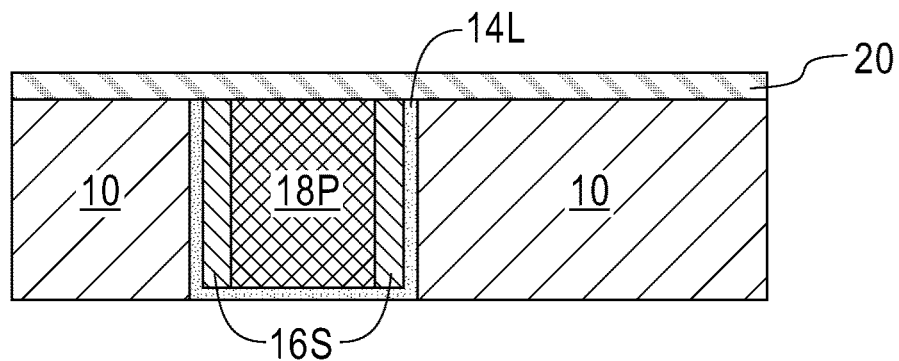
FIG. 6 is a cross sectional view of the exemplary structure of FIG. 5 after forming a first dielectric cap layer thereon.

Referring now to FIG. 6, there is illustrated the exemplary structure of FIG. 5 after forming a first dielectric cap layer 20 thereon. In some embodiment, the formation of the first dielectric cap layer 20 can be omitted. When present, the first dielectric cap layer 20 is formed on the physically exposed topmost surfaces of each of the first interconnect dielectric material layer 10, the first diffusion barrier liner 14L, each first seed enhancement spacer 16S, and the first interconnect metal or metal alloy structure 18P.

When present, the first dielectric cap layer 20 may include any dielectric cap material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric cap material that provides the first dielectric cap layer 20 may be formed utilizing a deposition process such as, for example, chemical vapor deposition (CVD), plasma enhanced chemical vapor deposition (PECVD), atomic layer deposition (ALD), chemical solution deposition or evaporation. When present, first dielectric cap layer 20 may have a thickness from 10 nm to 100 nm. Other thicknesses that are lesser than 10 nm, or greater than 100 nm may also be used as the thickness of the first dielectric cap layer 20.

Figure 7:
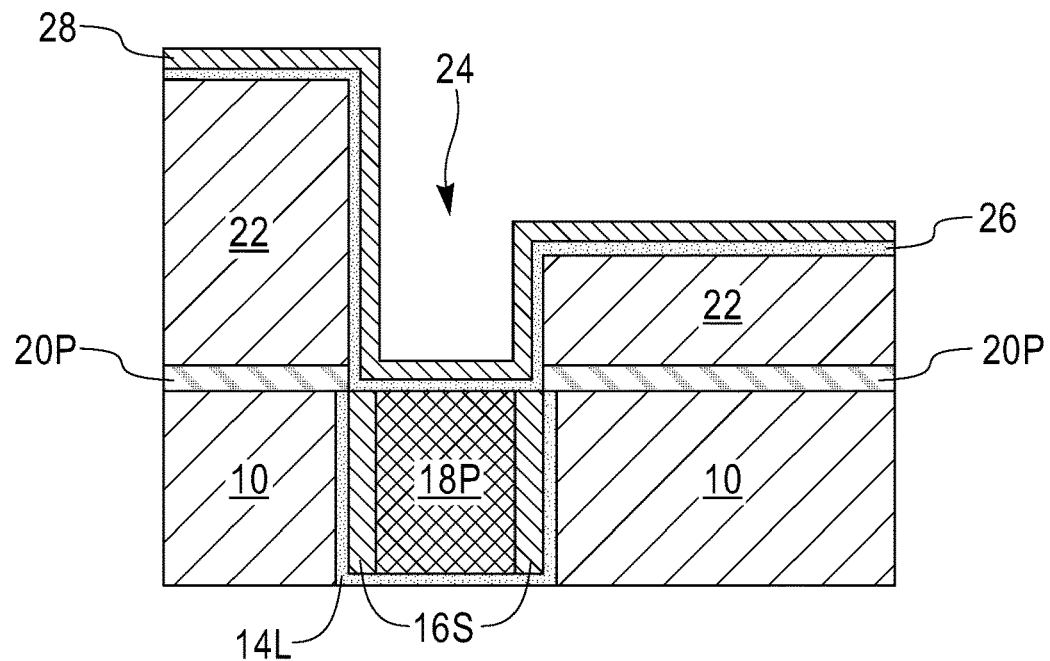
FIG. 7 is a cross sectional view of the exemplary structure of FIG. 6 after forming a second interconnect dielectric material layer including a second opening located therein that physically exposes a surface of the first interconnect metal or metal alloy structure, and forming a second diffusion barrier material layer and a second seed enhancement layer.

Referring now to FIG. 7, there is shown the exemplary structure of FIG. 6 after forming a second interconnect dielectric material layer 22 including a second opening 24 located therein that physically exposes a surface of the first interconnect metal or metal alloy structure 18P, and forming a second diffusion barrier material layer 26, and a second seed enhancement layer 28. In some embodiments, the processing shown in FIGS. 7-10 may be omitted.

In some embodiments, the second interconnect dielectric material layer 22 is formed directly upon the first dielectric cap layer 20. In embodiments in which the first dielectric cap layer 20 is omitted, the second interconnect dielectric material layer 22 can be formed directly upon the structure exemplified in FIG. 5 of the present application.

The second interconnect dielectric material layer 22 may include one of the dielectric materials mentioned above for the first interconnect dielectric material layer 10. In one embodiment, the dielectric material that provides the second interconnect dielectric material layer 22 is the same as the dielectric material that provides the first interconnect dielectric material layer 10. In another embodiment, the dielectric material that provides the second interconnect dielectric material layer 22 is different from the dielectric material that provides the first interconnect dielectric material layer 10. The second interconnect dielectric material layer 22 may be formed utilizing one of the deposition processes mentioned above for forming the first interconnect dielectric material layer 10. The second interconnect dielectric material layer 22 may have a thickness within the range mentioned above for the first interconnect dielectric material layer 10.

After providing the second interconnect dielectric material layer 22, second opening 24 is formed into the second interconnect dielectric material layer 22, and if present, entirely through the first dielectric cap layer 20; the remaining dielectric cap layer 20 can be referred to a patterned dielectric cap layer 20P. Although a single second opening 24 is described and illustrated, a plurality of second openings can be formed into the second interconnect dielectric material layer 22. The second opening 24 may be formed utilizing a patterning process as defined above for forming the first opening 12 in the first interconnect dielectric material layer 10. The second opening 24 may be a line opening, a via opening or a combined line and via opening. In FIG. 7, the second opening 24 is shown by way of one example as a combined line and via opening. In the illustrated embodiment the via opening is located at the bottom of the second opening 24, while the line opening is located directly atop the via opening. The via opening has a width that is less than the width of the line opening. To the right of the line opening shown in the drawings, a portion of the second interconnect dielectric material layer 22 would be present that is coplanar with the portion of the second interconnect dielectric material layer 22 shown on the far left hand side of the drawings.

The second diffusion barrier material layer 26 may include one of the diffusion barrier materials mentioned above for the first diffusion barrier material layer 14. In one embodiment, the diffusion barrier material that provides the second diffusion barrier material layer 26 is the same as the diffusion barrier material that provides the first diffusion barrier material layer 14. In another embodiment, the diffusion barrier material that provides the second diffusion barrier material layer 26 is different from the diffusion barrier material that provides the first diffusion barrier material layer 14. The second diffusion barrier material layer 26 may be formed utilizing one of the deposition processes mentioned above for forming the first diffusion barrier material layer 14. The second diffusion barrier material layer 26 may have a thickness within the range mentioned above for the first diffusion barrier material layer 14.

The second seed enhancement layer 28 may include one of the low resistivity metals or metal alloys mentioned above for the first seed enhancement layer 16. In one embodiment, the low resistivity metal or metal alloy that provides the second seed enhancement layer 28 is the same as the low resistivity metal or metal alloy that provides the first seed enhancement layer 16. In another embodiment, the low resistivity metal or metal alloy that provides the second seed enhancement layer 28 is different from the low resistivity metal or metal alloy that provides the first seed enhancement layer 16. The second seed enhancement layer 28 may be formed utilizing one of the deposition processes mentioned above for forming the first seed enhancement layer 16. The second seed enhancement layer 28 may have a thickness within the range mentioned above for the first seed enhancement layer 16.

Figure 8:
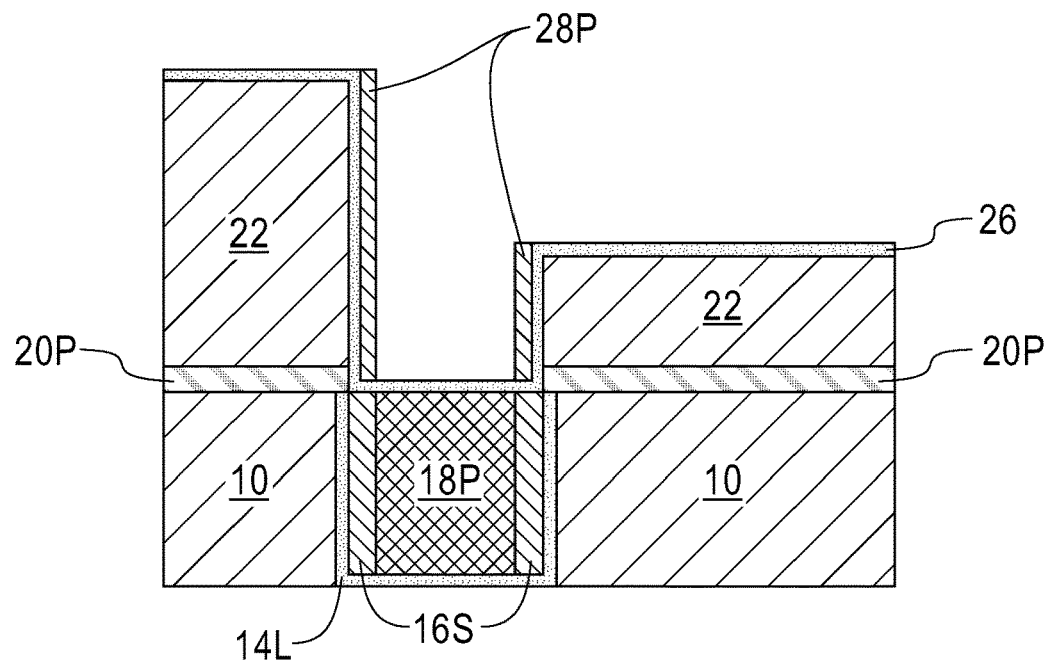
FIG. 8 is a cross sectional view of the exemplary structure of FIG. 7 after removing the second seed enhancement layer from horizontal surfaces of the second diffusion barrier material layer, while maintaining a portion of the second seed enhancement layer on vertical surfaces of the first diffusion barrier material layer in the second opening.

Referring now to FIG. 8, there is illustrated the exemplary structure of FIG. 7 after removing the second seed enhancement layer 28 from horizontal surfaces of the second diffusion barrier material layer 26, while maintaining a portion of the second seed enhancement layer 28 on vertical surfaces of the first diffusion barrier material layer 26 in the second opening 24.

Each remaining portion of the second seed enhancement material layer 28 may be referred to herein as a second seed enhancement pre-spacer 28P. Again the term 'pre-spacer' denotes a vertical extending pillar (or sheet) of seed enhancement material which is present prior to formation of an interconnect metal or metal alloy structure. Each second seed enhancement pre-spacer 28P has an outer sidewall that is in direct physical contact with an inner sidewall of the second diffusion barrier material layer 26, and an inner sidewall that at this point of the present application is bare, i.e., physically exposed. As is shown, each second seed enhancement pre-spacer 28P has a bottommost surface that is located only on a portion of the horizontal surface of the second diffusion barrier material layer 26 that is present inside the second opening 24; another portion of the horizontal surface of the second diffusion barrier material layer 26 that is present inside the second opening 24 and that is not covered by the second seed enhancement pre-spacers 28P is physically exposed. The second seed enhancement pre-spacers 28P can be formed utilizing one of the techniques mentioned above for forming the first seed enhancement pre-spacer 16P.

Figure 9:
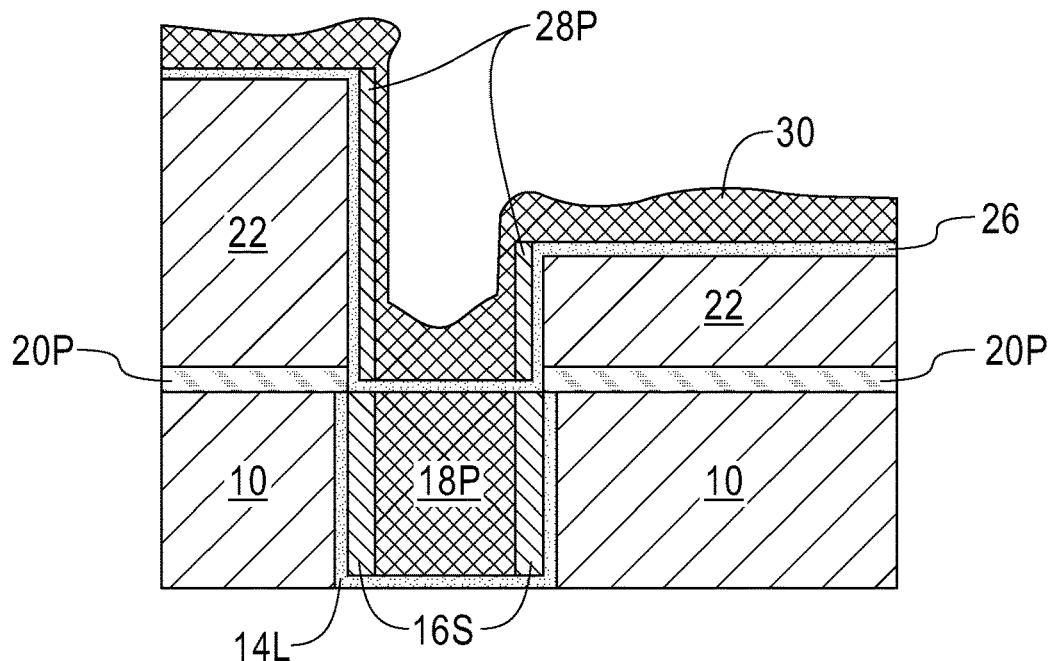
FIG. 9 is a cross sectional view of the exemplary structure of FIG. 8 after forming a second interconnect metal seed or metal alloy seed layer.
Figure 10:
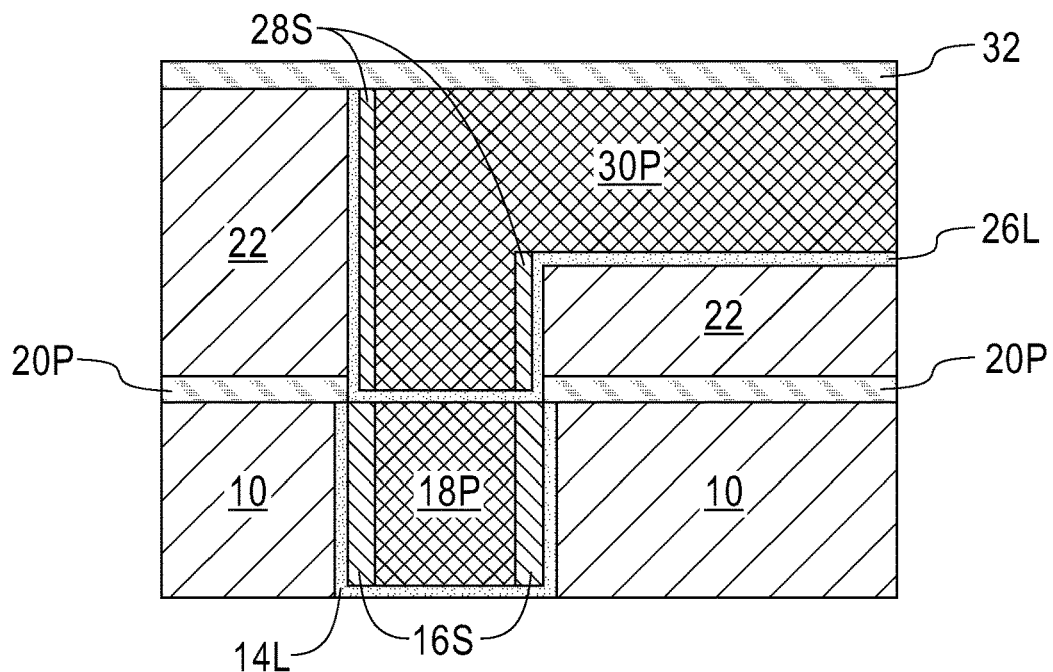
FIG. 10 is a cross sectional view of the exemplary structure of FIG. 9 after forming a second interconnect metal or metal alloy structure in the second opening, and forming a second dielectric cap layer thereon.

Referring now to FIG. 9, there is illustrated the exemplary structure of FIG. 8 after forming a second interconnect metal seed or metal alloy seed layer 30. In one embodiment, and as shown, the second interconnect metal seed or metal alloy seed layer 30 is a non-conformal layer that does not fill in the entirety of the remaining volume of the second opening 24. In such an embodiment, the thickness of the second interconnect metal seed or metal alloy seed layer 30 along horizontal surfaces is greater than the thickness of the second interconnect metal seed or metal alloy seed layer 30 along vertical surfaces. In such an embodiment, the interconnect metal or metal alloy seed layer deposition may be followed by an interconnect metal or metal alloy fill process such as electroplating to fill the opening with an interconnect metal or metal alloy, and form an overburden of the interconnect metal or metal alloy outside the second opening 24. In other embodiments (not shown), a second interconnect metal or metal alloy layer is formed that fills in an entirety of the second opening 24 and an overburden portion is present outside the second opening 24. In the present application, the second opening is filled with a second interconnect metal or metal alloy prior to performing a planarization step as shown in FIG. 10. The second interconnect metal or metal alloy includes one of the materials mentioned below for the second interconnect metal seed or metal alloy seed layer 30.

The second interconnect metal seed or metal alloy seed layer 30 may include one of the interconnect metals or metal alloys mentioned above for the first interconnect metal seed or metal alloy seed layer 18. In one embodiment, the interconnect metal or metal alloy that provides the second interconnect metal seed or metal alloy seed layer 30 is the same as the interconnect metal or metal alloy that provides the first interconnect metal seed or metal alloy seed layer 18. In another embodiment, the interconnect metal or metal alloy that provides the second interconnect metal seed or metal alloy seed layer 30 is different from the interconnect metal or metal alloy that provides the first interconnect metal seed or metal alloy seed layer 18. The second interconnect metal seed or metal alloy seed layer 30 may be formed utilizing one of the deposition processes mentioned above for forming the first interconnect metal seed or metal alloy seed layer 18. A reflow anneal, as defined above, may be performed after the deposition of the second interconnect metal seed or metal alloy seed layer 30.

Referring now to FIG. 10, there is illustrated the exemplary structure of FIG. 9 after forming a second interconnect metal or metal alloy structure 30P in the second opening 24, and forming a second dielectric cap layer 32 thereon. In some embodiments, the formation of the second dielectric cap layer 32 can be omitted.

The second interconnect metal or metal alloy structure 30P is formed by performing a planarization process. The planarization, which may include chemical mechanical polishing and/or grinding, removes all material that is present outside the second opening 24 and that is located above the topmost surface of the second interconnect dielectric material layer 22. Thus, the planarization removes the second interconnect metal or metal alloy (or the reflowed second interconnect metal or metal alloy), an upper portion of each second seed enhancement pre-spacer 28P that protrudes above the second opening 24 and the second diffusion barrier material layer 26. The remaining portion of the second interconnect metal or metal alloy (or the reflowed second interconnect metal or metal alloy) can be referred to as a second interconnect metal or metal alloy structure 30P, each remaining second seed enhancement pre-spacer 28P can be referred to a second seed enhancement spacer 28S, and the remaining portion of the second diffusion barrier material layer 26 can be referred to as a second diffusion barrier liner 26L.

Each second seed enhancement spacer 28S is a vertical pillar (and is I-shaped) that extends upward from a portion of the horizontal surface of the second diffusion barrier liner 26L. The second diffusion barrier liner 26L, some of the second seed enhancement spacers 28S, and the second interconnect metal or metal alloy structure 30P have topmost surfaces that are coplanar with each other as well as being coplanar with a topmost surface of the second interconnect dielectric material layer 22. As is shown, a bottommost surface of the second interconnect metal or metal alloy structure 30P directly contacts a portion of the horizontal surface of the second diffusion barrier liner 26L which is not covered by the second seed enhancement spacers 28S.

Each second seed enhancement spacer 26S has an inner sidewall that directly contacts a sidewall of the second interconnect metal or metal alloy structure 30P and an outer sidewall that directly contacts a vertical portion of the second diffusion barrier liner 26L. The sidewalls of the second interconnect metal or metal alloy structure 30P are thus spaced apart from the vertical portions of the second diffusion barrier liner 26L by the second seed enhancement spacers 28S. The presence of the second seed enhancement spacers 28S prevents the formation of sidewall voids, while enabling low via and line resistance within the structure.

FIG. 10 represents a second interconnect level that is formed above the first interconnect level. The second interconnect level includes the second interconnect dielectric material layer 22 containing the second opening 24 having vertical sidewalls and a bottom wall that physically exposes a surface of the first metal or metal alloy structure 18P that is embedded in the first interconnect dielectric material layer 10 of the first interconnect level. The second diffusion barrier liner 26L is located in the second opening 24 and lines the vertical sidewalls and the bottom wall of the second opening 24, the second seed enhancement spacer 28S is directly contacting each inner sidewall of the second diffusion barrier liner 26L, and the second interconnect metal or metal alloy structure 30P directly contacts inner sidewalls of each second seed enhancement spacer 28S and a horizontal portion of second diffusion barrier liner 26L that is located on the bottom wall of the second opening 24. Collectively, elements 26L, 28S and 30P may be referred to as a second interconnect structure that is, at least in part, embedded in second dielectric material layer 22.

When present, the second dielectric cap layer 32 is formed on the physically exposed topmost surfaces of each of the second interconnect dielectric material layer 22, the second diffusion barrier liner 26L, each second seed enhancement spacer 28S, and the second interconnect metal or metal alloy structure 30P. The second dielectric cap layer 32 may include one of the dielectric cap materials mentioned above for the first dielectric cap layer 20. In one embodiment, the dielectric cap material that provides the second dielectric cap layer 32 is the same as the dielectric cap material that provides the first dielectric cap layer 20. In another embodiment, the dielectric cap material that provides the second dielectric cap layer 32 is different from the dielectric cap material that provides the first dielectric cap layer 20. The second dielectric cap layer 32 may be formed utilizing one of the deposition processes mentioned above for forming the first dielectric cap layer 20. The second dielectric cap layer 32 may have a thickness within the range mentioned above for the first dielectric cap layer 20.

The above processing steps shown in FIGS. 7-10 may be repeating numerous times to provide other interconnect levels atop the two interconnect levels shown in FIG. 10. In each of the additional interconnect levels includes seed enhancement spacers that prevent the formation of sidewall voids between the diffusion barrier liner and the interconnect metal or metal alloy structure, while enabling low via and line resistance within the structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising a first interconnect level, the first interconnect level comprising:
   a first interconnect dielectric material layer containing a first opening having vertical sidewalls and a bottom wall;
   a first diffusion barrier liner located in the first opening and lining the vertical sidewalls and the bottom wall of the first opening;
   a first seed enhancement spacer directly contacting each inner sidewall of the first diffusion barrier liner and comprising a metal or metal alloy that facilitates movement of an interconnect metal or metal alloy during a reflow anneal process, and is selected from the group consisting of at least one of ruthenium, rhodium, iridium, osmium and cobalt; and
   a first interconnect metal or metal alloy structure directly contacting inner sidewalls of each first seed enhancement spacer and directly contacting a horizontal portion of the first diffusion barrier liner that is located on the bottom wall of the first opening.

2. The structure of claim 1, wherein the metal or metal alloy that provides each first seed enhancement spacer has a resistivity of 15E-8 ohm-meter or less.

3. The structure of claim 1, wherein each first seed enhancement spacer is I-shaped.

4. The structure of claim 1, wherein each of the first diffusion barrier liner, the first seed enhancement spacers, and the first interconnect metal or metal alloy structure has a topmost surface that is coplanar with each other and with a topmost surface of the first interconnect dielectric material layer.

5. The structure of claim 1, wherein the first diffusion barrier liner is U-shaped.

6. The structure of claim 1, further comprising a dielectric cap layer located on the first interconnect level.

7. A method of forming a structure, the method comprising:
   providing an opening in an interconnect dielectric material layer;
   forming a diffusion barrier material layer in the opening and on a topmost surface of the interconnect dielectric material layer; forming a seed enhancement pre-spacer directly contacting each inner sidewall of the diffusion barrier material layer;
   forming an interconnect metal or metal alloy on physically exposed surfaces of the seed enhancement pre-spacers and the diffusion barrier material layer, wherein the forming of the interconnect metal or metal alloy comprises a reflow anneal, and wherein the seed enhancement pre-spacer comprises a metal or metal alloy that facilitates movement of the interconnect metal or metal alloy during the reflow anneal, and is selected from the group consisting of at least one of ruthenium, rhodium, iridium, osmium, and cobalt; and
   removing portions of the interconnect metal or metal alloy, the seed enhancement pre-spacers and the diffusion barrier material layer outside the opening to provide an interconnect structure in the opening, the interconnect structure comprising a remaining portion of the diffusion barrier material layer located in the opening and lining vertical sidewalls and a bottom wall of the opening, a remaining portion of the seed enhancement pre-spacer directly contacting each inner sidewall of the remaining portion of the diffusion barrier material layer, and a remaining portion of the interconnect metal or metal alloy directly contacting inner sidewalls of each remaining portion of the seed enhancement pre-spacers and directly contacting a horizontal portion of the remaining portion of the diffusion barrier material layer that is located on the bottom wall of the opening.

8. The method of claim 7, wherein the forming the seed enhancement pre-spacer comprises:
   forming a seed enhancement layer on a physically exposed surface of the diffusion barrier material layer, and
   performing a spacer etch.

9. The method of claim 8, wherein the metal or metal alloy that provides the seed enhancement pre-spacer has a resistivity of 15E-8 ohm-meter or less.

10. The method of claim 7, wherein each the remaining portion of the seed enhancement pre-spacer comprises an I-shaped seed enhancement spacer that has a topmost surface that is coplanar with a topmost surface of the remaining portion of the diffusion barrier material layer and a topmost surface of the remaining portion of the interconnect metal or metal alloy.

11. The method of claim 7, further comprising forming a dielectric cap layer after the removing the portions of the interconnect metal or metal alloy, the seed enhancement pre-spacers and the diffusion barrier material layer outside the opening.

12. The method of claim 7, further comprising forming another interconnect structure above the interconnect structure embedded in the interconnect dielectric material layer.

13. The method of claim 12, wherein the forming the another interconnect structure comprises:
   providing another interconnect dielectric material layer located above the interconnect structure embedded in the interconnect dielectric material layer, the another interconnect dielectric material layer contains another opening that physically exposes a surface of the interconnect structure;
   forming another diffusion barrier material layer in the another opening and on a topmost surface of the another interconnect dielectric material layer,
   forming another seed enhancement pre-spacer directly contacting each inner sidewall of the another diffusion barrier material layer;
   forming another interconnect metal or metal alloy on physically exposed surfaces of the another seed enhancement pre-spacers and the another diffusion barrier material layer, wherein the forming of the another interconnect metal or metal alloy comprises another reflow anneal, and wherein the another seed enhancement pre-spacer comprises another metal or metal alloy that facilitates movement of the another interconnect metal or metal alloy during the another reflow anneal; and
   removing portions of the another interconnect metal or metal alloy, the another seed enhancement pre-spacers and the another diffusion barrier material layer outside the another opening.

\* \* \* \* \*